(12) United States Patent
Kado et al.

(10) Patent No.: US 7,744,699 B2
(45) Date of Patent: Jun. 29, 2010

(54) SUBSTRATE TREATING APPARATUS AND METHOD

(75) Inventors: Yoshikazu Kado, Kyoto (JP); Tsuyoshi Tomita, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1134 days.

(21) Appl. No.: 11/387,880

(22) Filed: Mar. 22, 2006

(65) Prior Publication Data

US 2006/0213433 A1 Sep. 28, 2006

(30) Foreign Application Priority Data

Mar. 23, 2005 (JP) .............................. 2005-083673

(51) Int. Cl.
*B08B 7/00* (2006.01)
*G05D 23/00* (2006.01)

(52) U.S. Cl. .................... 134/18; 165/288; 165/289; 432/36; 432/68; 700/299; 700/300

(58) Field of Classification Search ....................... None
See application file for complete search history.

(56) References Cited

U.S. PATENT DOCUMENTS

| 5,927,077 A * | 7/1999 | Hisai et al. ................. 62/3.3 |
| 6,600,779 B1 * | 7/2003 | Sawada et al. ............. 375/233 |
| 2004/0140365 A1 | 7/2004 | Izuta |

FOREIGN PATENT DOCUMENTS

| JP | 2002-43271 | 2/2002 |
| JP | 2002-100605 | 4/2002 |
| JP | 2002100605 A * | 4/2002 |
| JP | 2004-221540 | 8/2004 |
| JP | 2004-356409 | 12/2004 |

OTHER PUBLICATIONS

English Machine Translation for JP 2002-100605.*

* cited by examiner

*Primary Examiner*—Michael Cleveland
*Assistant Examiner*—Nicole Blan
(74) *Attorney, Agent, or Firm*—Ostrolenk Faber LLP

(57) ABSTRACT

A substrate treating apparatus includes a treating unit for treating substrates, a piping for supplying a treating liquid to the treating unit, a heater mounted on the piping, an electronic thermal unit mounted on the piping in series with the heater, a temperature sensor for measuring a temperature of the treating liquid, and a controller for controlling the heater and the electronic thermal unit. The controller sets a first temperature control mode for performing a room temperature control using the electronic thermal unit when the temperature measured by the temperature sensor is below a predetermined boundary temperature between room temperature and high temperature, and for performing a high temperature control with the heater when the temperature measured by the temperature sensor is above the predetermined boundary temperature between room temperature and high temperature. The controller sets a second temperature control mode for performing a heating control using the heater and the electronic thermal unit to heat the treating liquid when a difference between the temperature measured by the temperature sensor and a target temperature at least corresponds to a first specified value set beforehand. Further, the controller sets the first temperature control mode when, after the second temperature control mode is set, the difference between the temperature measured by the temperature sensor and the target temperature becomes less than a second specified value set beforehand.

2 Claims, 5 Drawing Sheets

CONTROL IN TIME OF TEMPERATURE INCREASE

CONTROL IN TIME OF TEMPERATURE DECREASE

SUBSTRATE TREATING APPARATUS AND METHOD

BACKGROUND OF THE INVENTION (1) Field of the Invention

This invention relates to a substrate treating apparatus and method for treating, with a treating liquid, substrates such as semiconductor wafers, glass substrates for liquid crystal displays or glass substrates for photomasks (hereinafter called simply "substrates"). More particularly, the invention relates to a technique for adjusting the temperature of the treating liquid.

(2) Description of the Related Art

Conventionally, this type of substrate treating apparatus includes an inner tank for storing a treating liquid and immersing substrates therein, an outer tank for collecting the treating liquid overflowing the inner tank, a piping for interconnecting the inner tank and outer tank for mutual communication, a temperature control unit mounted on the piping, and a circulating pump also mounted on the piping. See Japanese Unexamined Patent Publication No. 2002-100605 (page 5 and FIG. 3), for example.

In the apparatus having the above construction, while the circulating pump delivers the treating liquid under pressure, the temperature control unit adjusts the treating liquid to a predetermined temperature for introduction into the inner tank. An electronic thermal unit or a heater is used as the temperature control unit.

The conventional apparatus noted above has the following drawbacks.

In the conventional apparatus, where an electronic thermal unit is used as the temperature control unit, temperature control is impossible for a relatively high temperature range (e.g. 50-180° C.). With a heater, on the other hand, temperature control can be carried out only with low accuracy for a relatively low temperature range (e.g. 20-40° C.). The heater has a further disadvantage that, when a target temperature for temperature control is set low, the control must depends on a temperature fall by natural cooling, and thus a long time is taken to complete the temperature control. In other words, a temperature control covering a large range cannot be performed efficiently, and temperature control accuracy is low also.

In order to solve the above problems, it is conceivable to bifurcate a portion of the piping, and install an electronic thermal unit on one branch pipe and a heater on the other branch pipe. Temperature control may be carried out with either the electronic thermal unit or the heater according to a target temperature. However, such an exclusive use requires switch valves to be mounted upstream and downstream of the branch pipes. This poses a problem of complicating the construction.

SUMMARY OF THE INVENTION

This invention has been made having regard to the state of the art noted above, and its object is to provide a substrate treating apparatus and method for controlling temperature over a relatively large range and with high accuracy, without complicating the construction, The above object is fulfilled, according to this invention, by a substrate treating apparatus comprising a treating unit for treating substrates; a piping for supplying a treating liquid to the treating unit; a heater mounted on the piping; an electronic thermal unit mounted on the piping in series with the heater; a temperature sensor for measuring a temperature of the treating liquid; and a controller for controlling the heater and the electronic thermal unit; wherein the controller is arranged to set a first temperature control mode for performing a room temperature control using the electronic thermal unit when the temperature measured by the temperature sensor is below a predetermined boundary temperature between room temperature and high temperature, and for performing a high temperature control using the heater when the temperature measured by the temperature sensor is above the predetermined boundary temperature between room temperature and high temperature; set a second temperature control mode for performing a heating control using the heater and the electronic thermal unit to heat the treating liquid when a difference between the temperature measured by the temperature sensor and a target temperature at least corresponds to a first specified value set beforehand; and set the first temperature control mode when, after the second temperature control mode is set, the difference between the temperature measured by the temperature sensor and the target temperature becomes less than a second specified value set beforehand.

According to this invention, the heater and electronic thermal unit are arranged in series on the piping that supplies the treating liquids. The controller sets the first temperature control mode (i.e. a temperature control mode in steady state) for performing a room temperature control using the electronic thermal unit when the temperature measured by the temperature sensor is below the boundary temperature between room temperature and high temperature, and for performing a high temperature control using the heater when the temperature measured by the temperature sensor is above the boundary temperature. The controller sets the second temperature control mode (i.e. a temperature control mode in transient state) for performing a heating control using the heater and electronic thermal unit to heat the treating liquid when a difference between the temperature measured by the temperature sensor and the target temperature at least corresponds to a first specified value set beforehand. That is, when the difference between the measured temperature and target temperature is large and the treating liquid is to be heated, a rapid heating is carried out by using the electronic thermal unit in addition to the heater. When the difference between the measured temperature and target temperature subsequently becomes less than a second specified value set beforehand, the controller sets the first temperature control mode (i.e. the temperature control mode in steady state). That is, the temperature control mode in steady state is reinstated when the measured temperature has approached the target temperature after the temperature control for rapid heating.

In other words, temperature control is started by using the electronic thermal unit having an excellent temperature control capability at relatively low temperature when the measured temperature is below the boundary temperature between room temperature and high temperature, and by using the heater having an excellent temperature control capability at relatively high temperature when the measured temperature is above the boundary temperature (the first temperature control mode). When the difference between the measured temperature and target temperature is "large" and a "temperature increase" is to be obtained, the temperature increase is obtained by making the most of the heating power, i.e. by using both the heater having a high heating capability and the electronic thermal unit having a heating capability, though low (the second temperature control mode). Further, when the difference between the measured temperature and target temperature is "large" and a "cooling" is to be carried out, the temperature is lowered by using only the electronic thermal unit having a high cooling capability (temperature control mode in transient state). When the measured temperature approaches the target temperature and the difference has become small, a switching is made to the temperature control mode in steady state using one of the electronic thermal unit having a high degree of temperature control precision adjacent the current temperature, and the heater.

Thus, the construction can be simplified by arranging the heater and electronic thermal unit in series on the piping, compared with the parallel arrangement. The temperature control is started with the temperature control device suited for a temperature measured in time of starting the temperature control. When the measured temperature shows a large deviation from the target temperature, the temperature control devices are combined or one of them is selected. When the measured temperature has approached the target temperature, a switching is made to the temperature control device suited for the current temperature. In this way, the temperature control can be made over a relatively large range, and that with a high degree of accuracy. The accuracy of temperature control is enhanced while achieving a temperature control covering a relatively large range, without complicating the construction.

In another aspect of the invention, a substrate treating apparatus comprises a treating unit for treating substrates; a piping for supplying a treating liquid to the treating unit; a heater mounted on the piping; an electronic thermal unit mounted on the piping in series with the heater; a temperature sensor for measuring a temperature of the treating liquid; and a controller for controlling the heater and the electronic thermal unit; wherein the controller is arranged to set a first temperature control mode for performing a room temperature control using the electronic thermal unit when the temperature measured by the temperature sensor is below a predetermined boundary temperature between room temperature and high temperature, and for performing a high temperature control using the heater when the temperature measured by the temperature sensor is above the predetermined boundary temperature between room temperature and high temperature; set a second temperature control mode for performing a cooling control using the electronic thermal unit to cool the treating liquid when a difference between the temperature measured by the temperature sensor and a target temperature at least corresponds to a first specified value set beforehand; and set the first temperature control mode when, after the second temperature control mode is set, the difference between the temperature measured by the temperature sensor and the target temperature becomes less than a second specified value set beforehand.

The controller may be arranged to perform a PID control of the electronic thermal unit in time of the room temperature control, and perform a PID control of the heater in time of the high temperature control.

Then, even in the case of a small difference between current temperature and target temperature, the PID control enables a smooth temperature control, with an offset corrected automatically to realize quick responses to disturbances.

The controller may be arranged to perform a PID control of the heater and control the electronic thermal unit with a fixed control amount in time of the heating control. The controller may be arranged to control the electronic thermal unit with a fixed control amount in time of the cooling control.

For temperature increase, even when the difference between the measured temperature and target temperature is large, the temperature control by means of the heater having a large heating capacity is smooth, and with an offset corrected automatically to realize quick responses to disturbances. The temperature control, with a fixed control amount, by means of the electronic thermal unit having a small heating capacity can change temperature smoothly and quickly to a target value. For temperature decrease, even when the difference between the measured temperature and target temperature is large, the temperature control, with a fixed control amount, by means of the electronic thermal unit having a high cooling capability can smoothly and quickly approach the target value.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
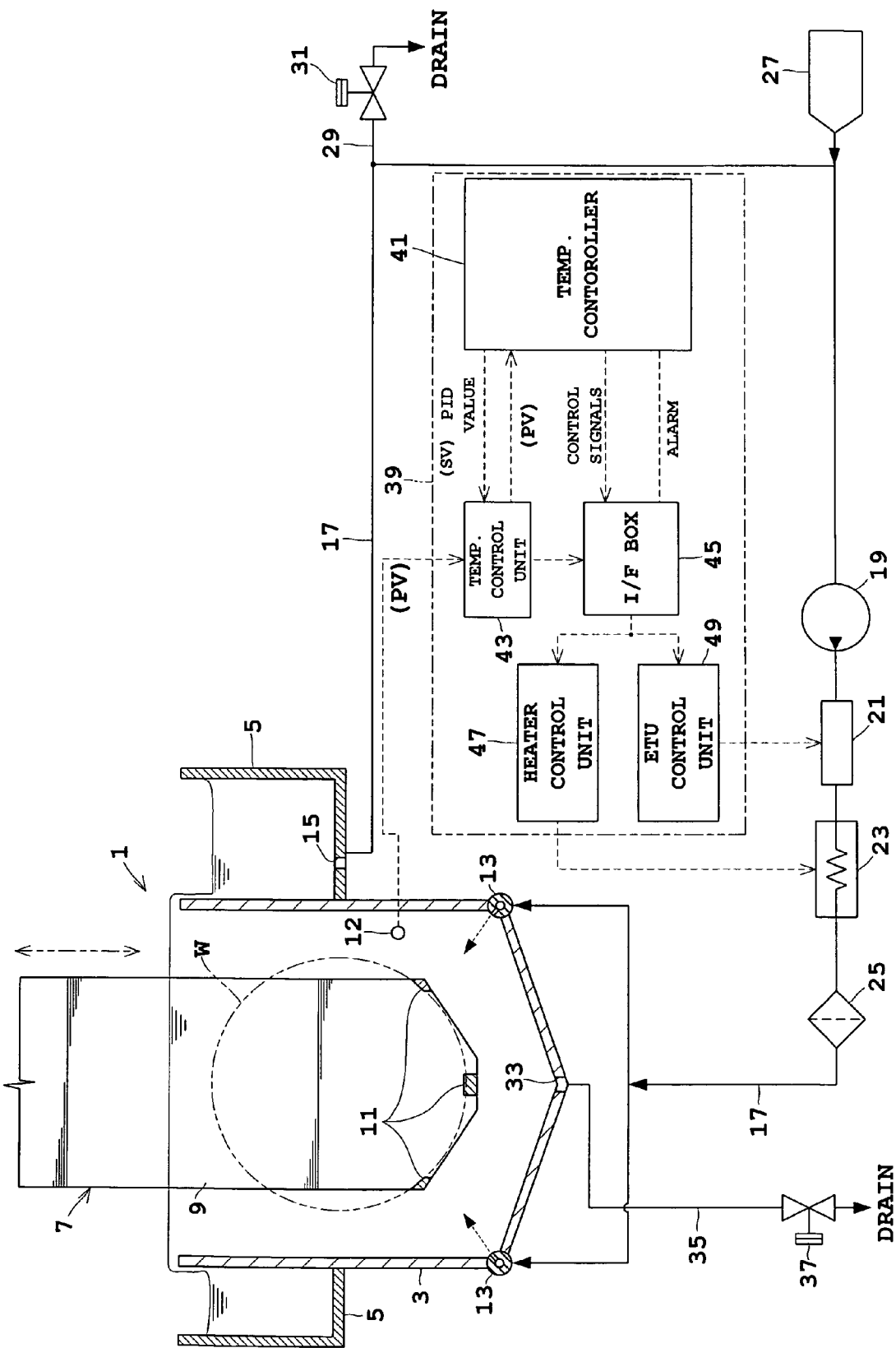
FIG. 1 is a block diagram showing an outline of a substrate treating apparatus according to the invention.

FIG. 1 is a block diagram showing an outline of a substrate treating apparatus according to the invention.

A treating tank 1 includes an inner tank 3 for storing a treating liquid or solution, and an outer tank 5 disposed around the inner tank 3 for collecting the treating liquid overflowing the inner tank 3. Circular wafers W under treatment are supported by a holding mechanism 7 vertically movable between a treating position inside the inner tank 3 and a standby position, not shown, above the inner tank 3. The holding mechanism 7 includes a back plate 9, and support elements 11 attached to lower positions of the back plate 9 and extending perpendicular to the plane of FIG. 1. Thus, the holding mechanism 7 is constructed for holding a plurality of wafers W at a time.

The inner tank 3 includes a temperature sensor 12 for measuring the temperature of the treating liquid and outputting a current temperature (PV), and filling pipes 13 arranged at opposite sides in the bottom thereof. The filling pipes 13 are in communication with a drain port 15 formed in the outer tank 5, through a piping 17. The piping 17 includes a pump 19, an electronic thermal unit (hereinafter abbreviated to ETU) 21, a heater 23 and a filter 25 arranged in order from upstream to downstream. A treating liquid source 27 is connected to the piping 17 upstream of the pump 19.

A drain pipe 29 branches from the piping 17 upstream of a point of supply from the treating liquid source 27. The drain pipe 29 has a switch valve 31 mounted thereon. By opening this switch valve 31, the treating liquid is drained from the outer tank 5 and piping 17. The inner tank 3 has a drain port 33 formed in the bottom thereof. A drain pipe 35 is connected to the drain port 33, and this pipe 35 has a further switch valve 37 mounted thereon.

The substrate treating apparatus having the above construction removes photoresist film from the wafers W as follows, for example. The switch valves 31 and 37 are closed during a film removing operation.

The treating liquid, which contains sulfuric acid and hydrogen peroxide solution, is supplied from the treating liquid source 27. The pump 19 is operated to supply the treating liquid to the inner tank 3 through the piping 17 and filling pipes 13. The treating liquid overflowing the inner tank 3 is collected in the outer tank 5 and returned to the inner tank 3 through the piping 17 and filling pipes 13. At this time, the heater 23 and ETU 21 are operated to heat the treating liquid to a predetermined temperature (or target temperature (SV)). When the treating liquid has reached the predetermined temperature, the wafers W (coated with photoresist film) supported by the holding mechanism 7 are lowered to the treating position inside the inner tank 3. The photoresist film formed on the wafers W is decomposed and separated from the surfaces of wafers W by the treating liquid.

Upon lapse of a predetermined time from start of the above process, the switch valve 37 is opened to drain the treating liquid from the inner tank 3, and deionized water is supplied from the treating liquid source 27 to the inner tank 3 through the piping 7 and filling pipes 13. This cleans the wafers W of the acid and the like adhering thereto. At this time, the deionized water is heated to the predetermined temperature (or target temperature (SV), e.g. 60° C.), as necessary, and is supplied as warm deionized water. After a predetermined time, the supply of deionized water from the treating liquid source 27 is stopped, and the switch valve 31 opened to drain the deionized water from the piping 17. The holding mechanism 7 is raised to the standby position to transport the treated wafers W out of the apparatus.

The wafers W are treated as described above, for example. The temperature control of the treating liquid includes a temperature control for heating the treating liquid containing sulfuric acid and hydrogen peroxide solution to a high temperature, and a temperature control for adjusting deionized water to a temperature lower than that of the above treating liquid. Such temperature control is performed by a controller 39.

The controller 39 includes a temperature controller 41, a temperature control unit 43, an I/F box 45, a heater control unit 47 and an ETU control unit 49.

The temperature control unit 43 receives the current temperature (PV) outputted from the temperature sensor 12, and outputs a temperature control signal to the I/F box 45 in response to the target temperature (SV) and a PID value transmitted from the temperature controller 41. The I/F box 45 receives control signals (e.g. four types of signals described hereinafter) from the temperature controller 41, and controls the heater control unit 47 and/or ETU control unit 49 according to the above control signals and the temperature control signal from the temperature control unit 43. The heater control unit 47 mainly controls power supply to the heater 23 on instructions from the I/F box 45. The ETU control unit 49 mainly controls power supply to the ETU 21 on instructions from the I/F box 45.

The control signals described above concern 1: ETU operation, 2: heater operation, 3: heating control amount restriction, and 4: cooling control amount restriction, for example.

1: ETU Operation

This is a control signal for using the ETU 21 by PID control. The signal uses a PID value for the ETU 21. The PID value is used in a room temperature control described hereinafter. Even in the case of a small difference between current temperature (PV) and target temperature (SV), the PID control enables a smooth temperature control, with an offset corrected automatically to realize quick responses to disturbances.

2: Heater Operation

This is a control signal for using the heater 23 by PID control. The signal uses a PID value for the heater 23. This PID value is used in a high temperature control and a heating control described hereinafter. The PID control produces the same effect as in the above ETU operation.

3: Heating Control Amount Restriction

This is a control signal for using the ETU 21 for heating, not by PID control but by a fixed control amount. For example, 50% is set as the fixed control amount. This is used in the heating control described hereinafter.

4: Cooling Control Amount Restriction

This is a control signal for using the ETU 21 for cooling, not by PID control but by a fixed control amount. For example, 50% is set as the fixed control amount. This is used in the cooling control described hereinafter.

When performing temperature control, the temperature controller 41 reads a treating temperature included in a recipe set through a setting device not shown, and specifying a treating procedure. The temperature controller 41 outputs the treating temperature as the target temperature (SV) to the temperature control unit 43, and outputs one of the above four types of control signals to the I/F box 45. Further, when required, the temperature controller 41 outputs the PID value to the temperature control unit 43. When setting the target temperature (SV) and selecting a control signal, the current temperature (PV) and a boundary temperature (C) between room temperature and high temperature outputted from the temperature control unit 43 are taken into consideration.

The controller 39 performs the temperature control through cooperation of the various components described above. The most outstanding characteristic lies in that the current temperature (PV) outputted from the temperature sensor 12 is taken into consideration, and the temperature control is carried out by switching between a "temperature control mode in steady state" for room temperature (normal temperature) control or high temperature control, and a "temperature control mode in transient state" for heating control or cooling control. The "steady state" refers to a situation where the current temperature (PV) is very close to the target temperature (SV). The "transient state" refers to a situation where the current temperature (PV) is far from the target temperature (SV). The above "close" is expressed by a relationship between combined use cancellation temperature r and combined use availing temperature r2, and a difference between current temperature (PV) and target temperature (SV). The combined use cancellation temperature r means a temperature in time of transition or switching from the heating control of the temperature control mode in transient state to the temperature control mode in steady state (room temperature control or high temperature control). The combined use availing temperature r2 is a parameter provided to avoid frequent transitions to the heating control, and an increased value thereof hampers a transition to the heating control. Specifically, when a relationship $|SV-PV| \leq r+r2$ is established, that is when the temperature difference is small, one of the two controls of the temperature control mode in steady state is adopted. When the above relationship does not apply, that is when the temperature difference is large, one of the two controls of the temperature control mode in transient state is adopted. When the relationship becomes $|SV-PV| \leq r$ after a switching is once made to the temperature control mode in transient state, the temperature control mode in steady state (room temperature control or high temperature control) is reinstated.

The combined use cancellation temperature r and combined use availing temperature r2 correspond to the first specified value in this invention. The combined use cancellation temperature r corresponds to the second specified value in this invention.

Of the temperature control mode in steady state, the "room temperature control" refers to a temperature control by means of the ETU 21, and the "high temperature control" to a temperature control by means of the heater 23. The ETU 21 has an electronic thermal device such as a Peltier element, for example, and can both lower and raise temperature. However, the ETU 21 can demonstrate a heating capability only at relatively low temperatures. On the other hand, the heater 23 is capable only of natural cooling by cutting off power supply thereto, but has an excellent heating performance at relatively high temperatures. The temperature controller 41 uses the boundary temperature (C) between room temperature and high temperature as a threshold for switching between the room temperature control and high temperature control. This boundary temperature (C) is 60° C., for example. In this example, the room temperature control is performed when the current temperature (PV) is below 60° C., and the high temperature control is performed when the current temperature (PV) is 60° C. or above. The control signals used in these cases are those described above in 1: ETU Operation and 2: Heater Operation, respectively.

The boundary temperature (C) between room temperature and high temperature may be set appropriately by taking the temperature control capabilities of ETU 21 and heater 23 into consideration.

Of the temperature control mode in transient state, the "heating control" refers to a temperature increase by means of the ETU 21 and heater 23, and the "cooling control" to a temperature decrease by means of the ETU 21. Thus, the heating control uses the heating capability of the ETU 21 in addition to the excellent heating capability at relatively high temperatures of the heater 23, thereby achieving a temperature increase in a short time. In the cooling control, temperature is forcibly lowered by the ETU 21, instead of relying on the natural cooling performed by stopping the heating by the heater 23, thereby achieving a temperature decrease in a short time.

Figure 2:
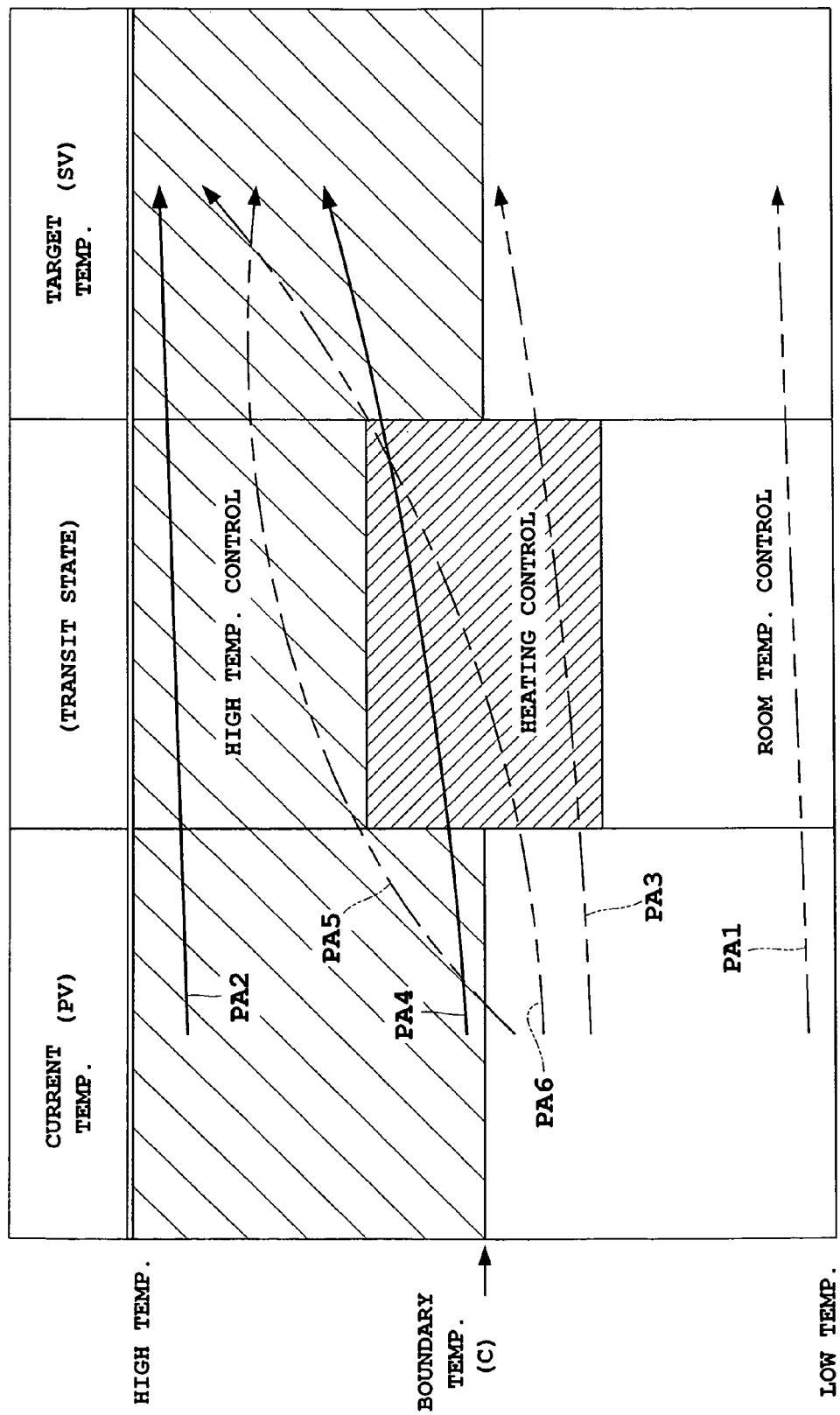
FIG. 2 is a schematic view showing patterns of temperature control in time of temperature increase.

Next, control in time of temperature increase will be described with reference to FIG. 2. FIG. 2 is a schematic view showing patterns of temperature control in time of temperature increase. In FIG. 2, the starting points, end points and lines of arrows are shown only schematically, and have no strict meaning for comparison purposes.

Pattern PA1 (room temperature control only);

The current temperature (PV) is below the boundary temperature (C) between room temperature and high temperature, and the difference between current temperature (PV) and target temperature (SV) is small ($|SV-PV| \leq r+r2$). Thus, no switching is made from the temperature control mode in steady state, but only the room temperature control is performed by means of the ETU 21.

Pattern PA2 (high temperature control only);

The current temperature (PV) is above the boundary temperature (C), and the difference between current temperature (PV) and target temperature (SV) is small ($|SV-PV| \leq r+r2$). Thus, no switching is made from the temperature control mode in steady state, but only the high temperature control is performed by means of the heater 23.

Pattern PA3 (room temperature control→heating control→high temperature control):

The current temperature (PV) is below the boundary temperature (C), and the difference between current temperature (PV) and target temperature (SV) is large ($|SV-PV|>r+r2$). Thus, after starting the room temperature control by means of the ETU 21 in the temperature control mode in steady state, a switching is made to the temperature control mode in transient state to perform the heating control by means of the ETU 21 and heater 23. When the difference has become small ($|SV-PV| \leq r$), a switching is made to the temperature control mode in steady state to perform the room temperature control by means of the ETU 21.

Pattern PA4 (high temperature control→heating control→high temperature control)

The current temperature (PV) is above the boundary temperature (C), and the difference between current temperature (PV) and target temperature (SV) is large ($|SV-PV|>r+r2$). Thus, after starting the high temperature control by means of the heater 23 in the temperature control mode in steady state, a switching is made to the temperature control mode in transient state to perform the heating control by means of the ETU 21 and heater 23. When the difference has become small ($|SV-PV| \leq r$), a switching is made to the temperature control mode in steady state to performs the high temperature control by means of the heater 23.

Pattern PA5 (room temperature control→high temperature control):

The current temperature (PV) is below the boundary temperature (C), and the difference between current temperature (PV) and target temperature (SV) is small ($|SV-PV| \leq r+r2$). Thus, after starting the room temperature control by means of the ETU 21 in the temperature control mode in steady state, a switching is made to the high temperature control by means of the heater 23, without changing the temperature control mode.

Pattern PA6 (room temperature control→heating control→high temperature control);

The current temperature (PV) is below the boundary temperature (C), and the difference between current temperature (PV) and target temperature (SV) is large ($|SV-PV|>r+r2$). Thus, after starting the room temperature control by means of the ETU 21 in the temperature control mode in steady state, a switching is made to the temperature control mode in transient state to perform the heating control by means of the ETU 21 and heater 23. When the difference has become small ($|SV-PV| \leq r$), a switching is made to the temperature control mode in steady state to perform the high temperature control by means of the heater 23.

Figure 3:
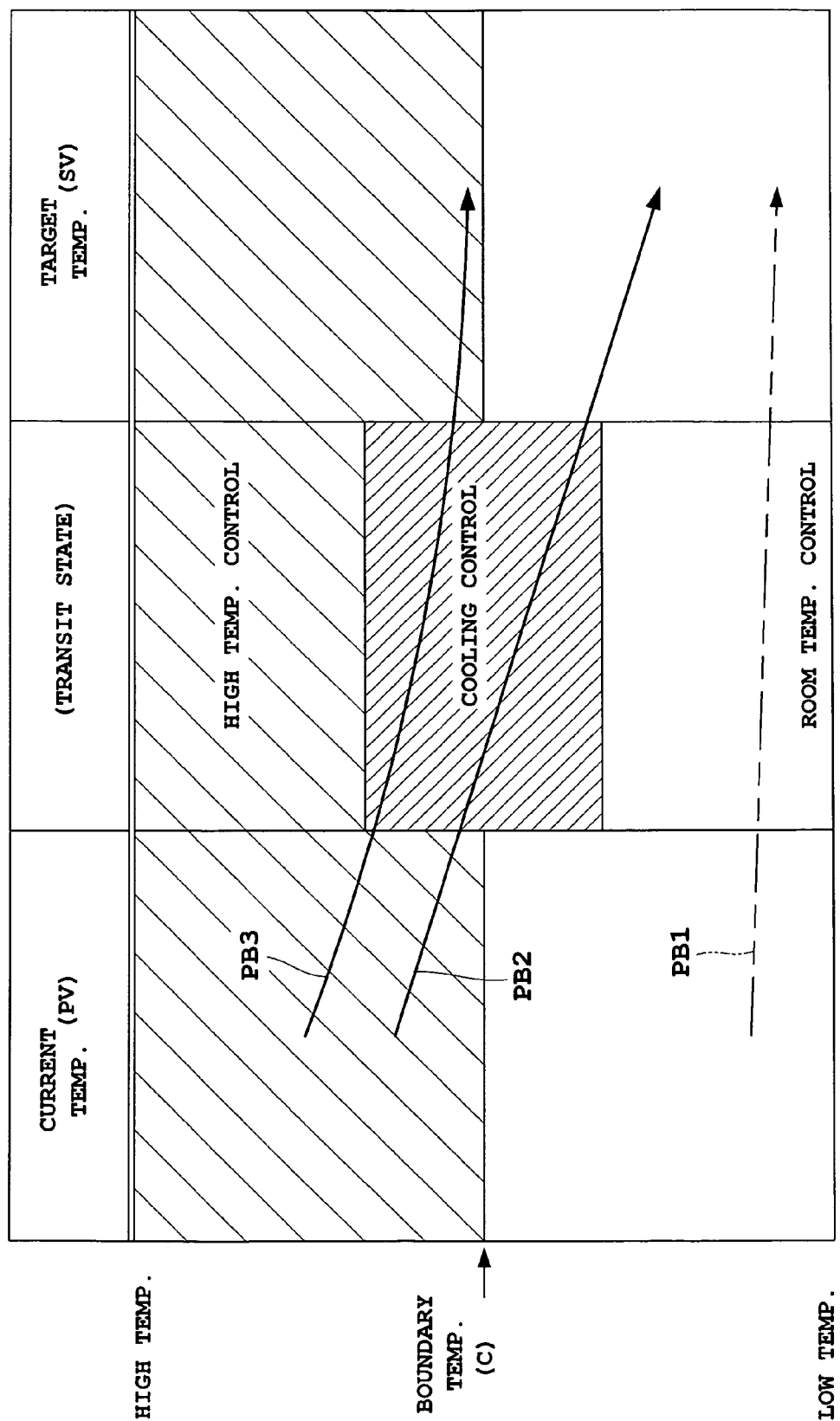
FIG. 3 is a schematic view showing patterns of temperature control in time of temperature decrease.

Next, control in time of temperature decrease will be described with reference to FIG. 3. FIG. 3 is a schematic view showing patterns of temperature control in time of temperature decrease. In FIG. 3, like those in FIG. 2, the starting points, end points and lines of arrows have no strict meaning.

Pattern PB1 (room temperature control only);

The current temperature (PV) is below the boundary temperature (C) between room temperature and high temperature, and the difference between current temperature (PV) and target temperature (SV) is small ($|SV-PV| \leq r+r2$). Thus, no switching is made from the temperature control mode in steady state, but only the room temperature control is performed by means of the ETU 21.

Pattern PB2 (high temperature control→cooling control→room temperature control);

The current temperature (PV) is above the boundary temperature (C), and the difference between current temperature (PV) and target temperature (SV) is large ($|SV-PV|>r+r2$).

Thus, after starting the high temperature control by means of the heater 23 in the temperature control mode in steady state, a switching is made to the temperature control mode in transient state to perform the cooling control by means of the ETU 21. When the difference has become small ($|SV-PV| \leq r$), a switching is made to the temperature control mode in steady state to perform the room temperature control by means of the ETU 21.

Pattern PB3 (high temperature control→cooling control→high temperature control):

The current temperature (PV) is above the boundary temperature (C), and the difference between current temperature (PV) and target temperature (SV) is large ($|SV-PV| > r+r2$). Thus, after starting the high temperature control by means of the heater 23 in the temperature control mode in steady state, a switching is made to the temperature control mode in transient state to perform the cooling control by means of the ETU 21. When the difference has become small ($|SV-PV| \leq r$), a switching is made to the temperature control mode in steady state to perform the high temperature control by means of the heater 23.

According to this embodiment, as described above, temperature control is started by using the ETU 21 having an excellent temperature control capability at relatively low temperatures when the current temperature (PV) is below the boundary temperature (C) between room temperature and high temperature, and by using the heater 23 having an excellent temperature control capability at relatively high temperatures when the current temperature (PV) is above the boundary temperature (C) between room temperature and high temperature (temperature control mode in steady state). When the difference between current temperature (PV) and target temperature (SV) is "large" and a "temperature increase" is to be obtained, the temperature increase is obtained by making the most of the heating power, i.e. by using both the heater 23 having a high heating capability and the ETU 21 having a heating capability, though low. When the difference between current temperature (PV) and target temperature (SV) is "large" and a "cooling" is to be carried out, the temperature is lowered by using only the ETU 21 having a high cooling capability (temperature control mode in transient state). When the current temperature (PV) approaches the target temperature (SV) and the difference has become small, a switching is made to the temperature control mode in steady state.

Thus, the construction can be simplified by arranging the heater 23 and ETU 21 in series on the piping 17, compared with the parallel arrangement proposed in the prior art. Temperature control is started with the temperature control device suited for a current temperature (PV) in time of starting the temperature control. When the current temperature (PV) shows a large deviation from the target temperature (SV), the temperature control devices are combined or one of them is selected, depending on whether the temperature should be raised or lowered. When the current temperature (PV) has approached the target temperature (SV), a switching is made to the temperature control device suited for the current temperature (PV). In this way, the temperature control can be made over a relatively large range, and that with a high degree of accuracy.

Figure 4:
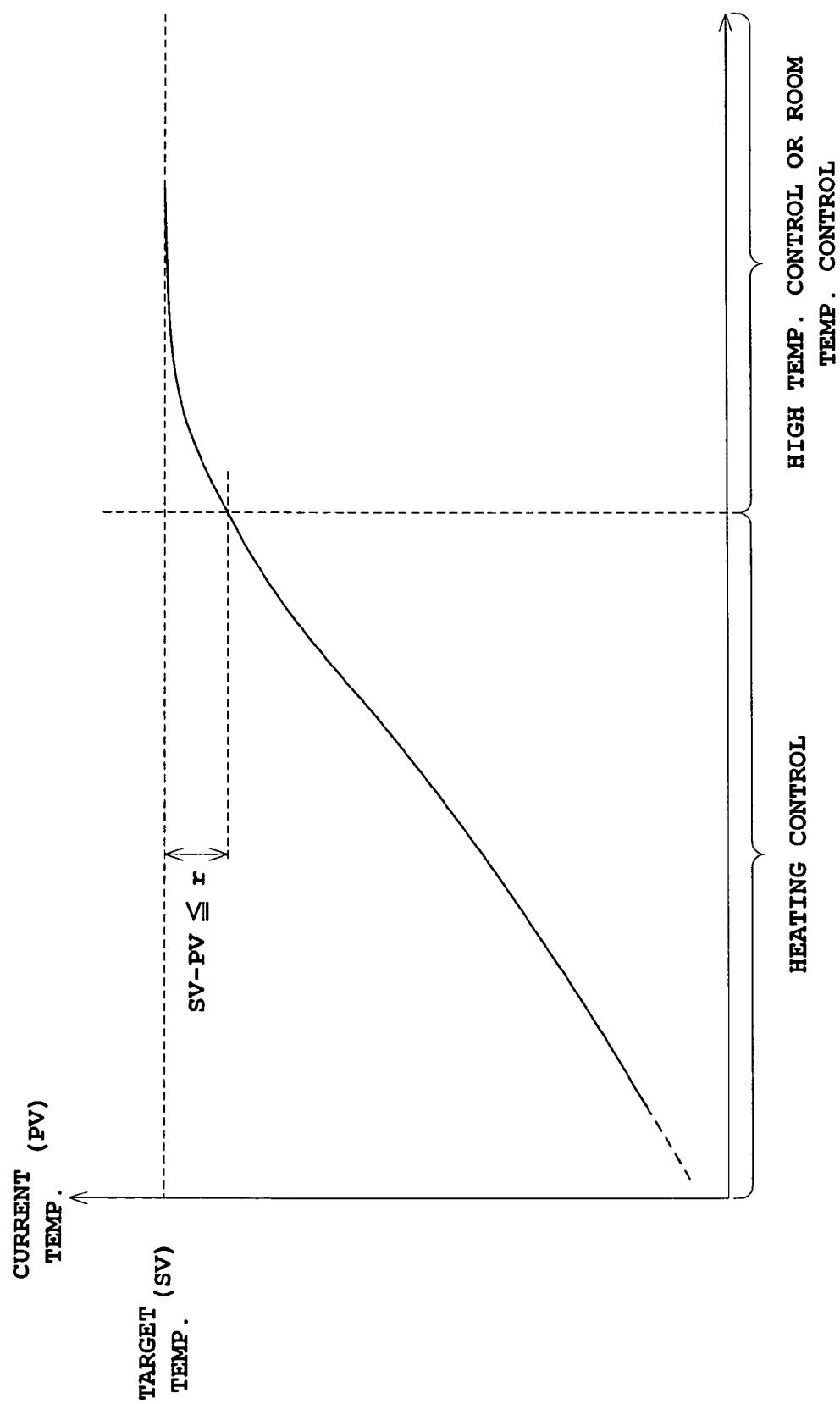
FIG. 4 is a schematic view showing an example of temperature change in time of temperature increase.

Reference is now made to FIG. 4. FIG. 4 is a schematic view showing an example of temperature change in time of temperature increase.

In the patterns PA3, PA4 and PA6 in time of temperature increase described above, a switching is made from the heating control, which is a temperature control pattern in transient state, to the high temperature control or room temperature control, which is a temperature control pattern in steady state, ultimately to bring the current temperature (PV) into agreement with the target temperature (SV). When, in the above process, target temperature (SV)−current temperature (PV) $\leq$ combined use cancellation temperature (r), it is preferable to switch the temperature control pattern. In the temperature control patterns of transient state, a temperature increase is obtained by PID control of the heater 23 and fixed control amount of the ETU 21 based on 2: Heater Operation and 3: Heating Control Amount Restriction. Thus, the temperature increase is obtained by making the most of the heating power.

With this control, even when the difference between current temperature (PV) and target temperature (SV) is large, the temperature control by means of the heater 23 having a large heating capacity is smooth, and with an offset corrected automatically to realize quick responses to disturbances. The temperature control, with a fixed control amount, by means of the ETU 21 having a small heating capacity can change temperature smoothly and quickly to a target value.

Figure 5:
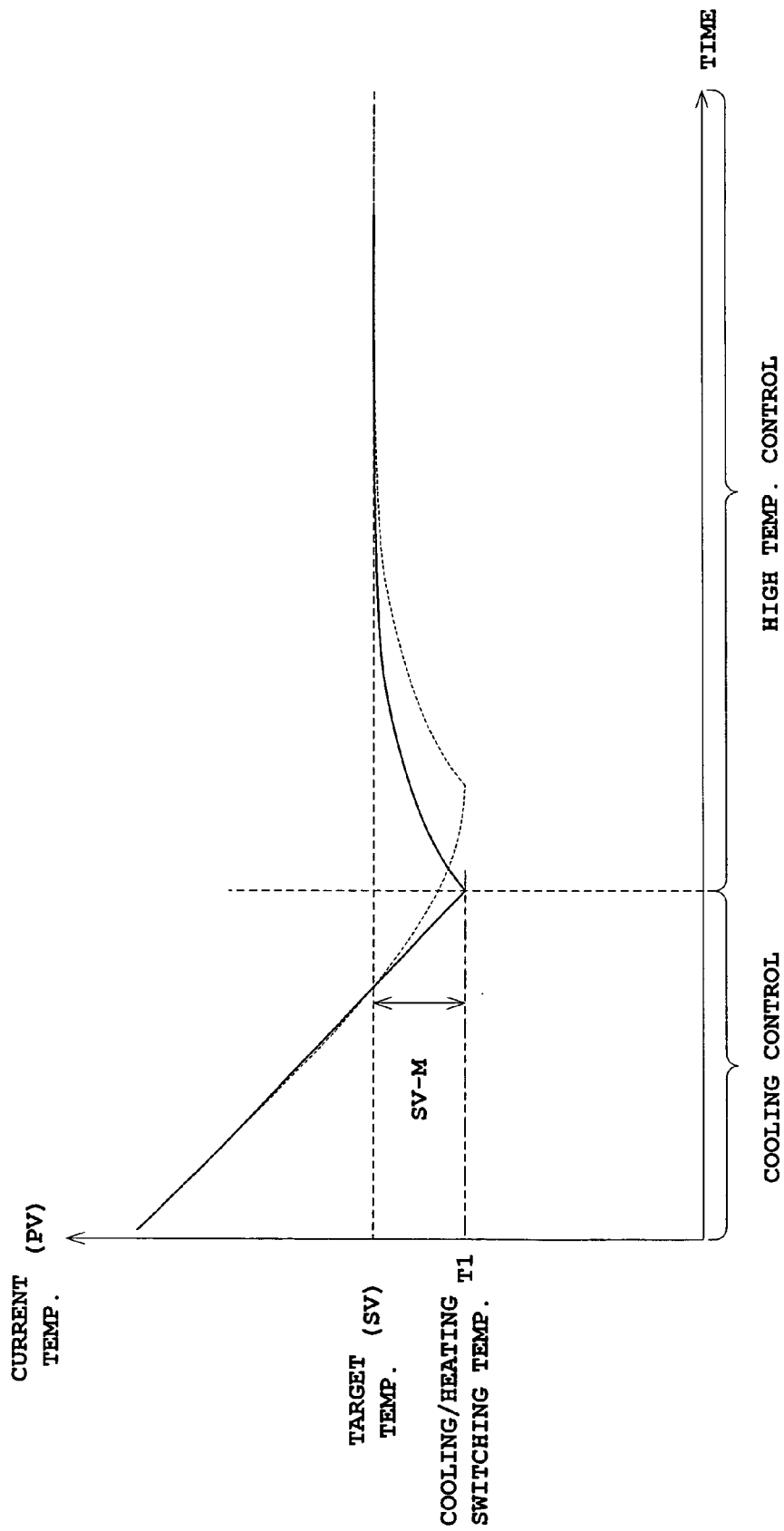
FIG. 5 is a schematic view showing an example of temperature change in time of temperature decrease.

Reference is made to FIG. 5. FIG. 5 is a schematic view showing an example of temperature change in time of temperature decrease.

In the pattern PB3 in time of temperature decrease described above, a switching is made from the cooling control, which is a temperature control pattern in transient state, to the high temperature control, which is a temperature control pattern in steady state, to approach the target temperature (SV). It is preferable that, in this process, the temperature is once lowered to a provisional target value, i.e. target temperature (SV)−fixed value (M)=cooling/heating switching temperature (T1), and after reaching the cooling/heating switching temperature (T1), a temperature increase is started toward the target temperature (SV). In the temperature control patterns of transient state, a temperature decrease is obtained by a fixed control amount based on 4: Cooling Control Amount Restriction. Thus, the switching to the high temperature control is effected quicker than a cooling by PID control (shown in a dotted line in FIG. 5).

With this control, even when the difference between current temperature (PV) and target temperature (SV) is large, the temperature control, with a fixed control amount, by means of the ETU 21 having a high cooling capability can smoothly and quickly approach the target value. Further, the heater 23 can turn on reliably by once lowering the temperature below the target temperature (SV).

This invention is not limited to the foregoing embodiment, but may be modified as follows:

(1) In the embodiment described above, the ETU 21 and heater 23 are arranged in series on the piping 17 intercommunicating the inner tank 1 and outer tank 5 for circulating the treating liquids. Instead, for example, the ETU 21 and heater 23 may be arranged on a piping for supplying the treating liquids to the inner tank 1 without circulating the liquids. The invention is not limited to the batch type as in the embodiment described above. The invention is applicable to the single-substrate type for treating one substrate at a time, as long as temperature control is performed for the treating liquids.

(2) The above embodiment has been described as controlling the temperature of the treating liquid containing sulfuric acid and hydrogen peroxide solution, and the treating liquid in the form of warm deionized water. Any other types of treating liquid may be subjected to the temperature control according to this invention.

(3) The above embodiment has been described as having a single temperature control unit 43. It is in accordance with this invention to provide two temperature control units for the ETU 21 and heater 23, respectively.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating substrates in a substrate treating apparatus having a treating unit for treating substrates, a piping for supplying a treating liquid to said treating unit, a heater mounted on said piping, an electronic thermal unit mounted on said piping in series with said heater, a temperature sensor for measuring a temperature of the treating liquid, and a controller for controlling said heater and said electronic thermal unit, said method comprising the steps, executed by said controller, of:

setting a first temperature control mode for performing a room temperature control using said electronic thermal unit when the temperature measured by said temperature sensor is below a predetermined boundary temperature between room temperature and high temperature, and for performing a high temperature control using said heater when the temperature measured by said temperature sensor is above the predetermined boundary temperature between room temperature and high temperature;

setting a second temperature control mode for performing a heating control using said heater and said electronic thermal unit to heat the treating liquid when a difference between the temperature measured by said temperature sensor and a target temperature at least corresponds to a first specified value set beforehand;

determining, after said second temperature control mode is set, whether the difference between the temperature measured by said temperature sensor and the target temperature becomes less than a second specified value set beforehand;

setting said first temperature control mode when, after said second temperature control mode is set, the difference between the temperature measured by said temperature sensor and the target temperature becomes less than the second specified value set beforehand; and continuing said second temperature control mode when the difference between the temperature measured by said temperature sensor and the target temperature becomes not less than the second specified value set beforehand.

2. A method as defined in claim 1, wherein said controller performs a PID control of said electronic thermal unit in time of said room temperature control, and performs a PID control of said heater in time of said high temperature control.

* * * * *